United States Patent [19]
Sakaue et al.

[11] 4,080,581
[45] Mar. 21, 1978

[54] CHARGE TRANSFER TRANSVERSAL FILTER

[75] Inventors: Tatsuo Sakaue, Yokohama; Nobuo Suzuki, Urawa, both of Japan

[73] Assignee: Tokyo Shibaura Electric Co., Ltd., Kawasaki, Japan

[21] Appl. No.: 681,700

[22] Filed: Apr. 29, 1976

[30] Foreign Application Priority Data

Apr. 30, 1975 Japan ................................. 50-51434
May 2, 1975 Japan ................................. 50-52493

[51] Int. Cl.² .............................................. H03H 7/00
[52] U.S. Cl. ............................ 333/70 T; 307/221 D; 357/24
[58] Field of Search ......................... 333/18, 70 T; 307/221 C, 221 D; 357/24

[56] References Cited
U.S. PATENT DOCUMENTS

| | | | |
|---|---|---|---|
| 3,609,597 | 9/1971 | Moye | 333/18 |
| 3,914,748 | 10/1975 | Barton et al. | 357/24 X |
| 3,935,439 | 1/1976 | Buss et al. | 307/221 D X |
| 3,946,247 | 3/1976 | Collins et al. | 333/70 T X |
| 3,978,435 | 8/1976 | Luvison et al. | 333/18 |
| 4,013,897 | 3/1977 | Kamigaki et al. | 307/221 D |

*Primary Examiner*—Paul L. Gensler
*Attorney, Agent, or Firm*—Oblon, Fisher, Spivak, McClelland & Maier

[57] ABSTRACT

A charge transfer transversal filter, wherein an input signal to the filter is branched off; an electric charge is generated in a semiconductor substrate according to each branch of the input signal supplied thereto; the electric charge is so weighted as to cause the filter to have a desired frequency characteristic; an electric charge thus weighted is introduced into a potential well of one delay means of a charge transfer device to be added to the electric charge transferred to the well from the preceding delay means; and the resultant mixture of electric charges is transferred through the charge transfer device.

14 Claims, 11 Drawing Figures

CHARGE TRANSFER TRANSVERSAL FILTER

BACKGROUND OF THE INVENTION

This invention relates to a transversal filter and more particularly to a charge transfer transversal filter using a charge transfer device.

The prior art transversal filter set forth, for example, in the Japanese Patent Application laid open Apr. 24, 1974 under Ser. No. 43,549, (based for priority on the U.S. patent application Ser. No. 257,252 filed on May 26, 1972 and now abandoned), has the following arrangement. A plurality of delay elements are connected in series, and an input signal is supplied to one terminal delay element. An intermediate leadout point is provided between every adjacent delay elements and the respective intermediate leadout points are connected to different weighting circuits to apply different weights to output signals from the respective delay elements. Output signals thus weighted are summed up in an adder. Output voltage from a transversal filter arranged as described above is expressed by the following equation as disclosed in "IEEE Journal of Solid State Circuits," Vol. SC-8, No. 2, Apr., 1973, p. 138:

$$V_{out}(nT_c) = \sum_{k=1}^{M} h_k V_k(nT_c) = \sum_{k=1}^{M} h_k V_{in}[(n-k)T_c] \quad (1)$$

where:

$T_c$ = delay time provided by unit delay means
$h_k$ = weighting coefficient
$V_k$ = voltage at an intermediate leadout point between every adjacent delay elements
$V_{in}$ = voltage of input signal
$V_{out}$ = voltage of output signal Where the value of the weighting coefficient $h_k$ is rendered equal to the Fourier coefficient included in the Fourier expansion of a function representing a desired frequency characteristic then there can be provided a filter having the desired frequency characteristic.

With the conventional transversal filter arranged as described above, a plurality of delay elements and an adder disposed separately from each other are connected by a weighting circuit, presenting the drawback that numerous circuit elements have to be used and particularly where such filter is formed of an integrated circuit by application of a charge transfer device (abbreviated as "CTD") like a bucket brigade device (abbreviated as "BBD") or charge coupled device (abbreviated as "CCD"), then the resultant integrated circuit contains a large number of elements, unavoidably leading to a low yield in constructing an integrated transversal filter.

Further where the delay elements of the prior art transversal filter are constituted by CCD's, an intermediate leadout point between the respective adjacent delay elements is formed of the so-called floating junction or floating gate. However, that part of the CCD delay element which is provided with the floating junction or floating gate increases in capacity, considerably retarding a charge transfer speed in said CCD delay element. Where, therefore, the CCD is used as the delay element of the prior art transversal filter, then the high speed characteristic or prominent advantage of the CCD is considerably lost.

With the prior art transversal filter set forth in the Japanese Patent Application laid open July 31, 1974 under Ser. No. 79,436, (based for priority on the U.S. patent application Ser. No. 303,440 filed on Nov. 3, 1972, now Pat. No. 3,819,958), one of a plurality of transferring electrodes each constituting a unit delay element or one bit is divided into two parts. The ratio which the area of one divided part of the electrode bore to that of the other divided part is determined according to a prescribed weighting coefficient. The divided parts of the electrode are supplied with charge current from an external source of driving pulse. With the above-mentioned known transversal filter, charge currents respectively supplied to the two divided parts of the electrode are detected by a differential amplifier, utilizing the fact that charge current delivered to the transferring electrode from the external source of driving pulse is proportional to an amount of a signal charge stored in a potential well formed below the transferring electrode. The charge currents respectively supplied to the two divided parts of the electrode correspond to an amount of weighted signal charge which is detected to obtain an output signal from the transversal filter.

With the known transversal filter arranged as described above, however, the transferring electrode is divided into two parts, and the discharged capacities of the two divided parts of the transferring electrode are determined by a differential detector. Therefore, the prior art transversal filter is undersirably provided with complicated means for detecting an output signal therefrom.

SUMMARY OF THE INVENTION

It is accordingly an object of this invention to provide a transversal filter wherein an input signal is branched off; each branch of the input signal is weighted; and the delay and addition of weighted signals corresponding to each branch of the input signal are effected by a single device, thereby decreasing the required number of circuit elements and consequently elevating a yield in manufacturing the transversal filter.

Another object of the invention is to provide a charge transfer transversal filter capable of accelarating an operational speed.

Still another object of the invention is to provide a charge transfer transversal filter adapted to be integrated.

A further object of the invention is to provide a charge transfer transversal filter of simple arrangement.

According to an aspect of this invention, there is provided a transversal filter, wherein an input signal is branched off to form a plurality of branched input signals; the branched input signals are weighted to allow the filter to have a desired frequency characteristic, whereby producing weighted signals, the weighted signals corresponding to the respective branched input signals are respectively supplied to a plurality of series connected delay elements constituting a delay-addition device, the weighted signals injected into the delay elements are added to the signals transferred from the proceding delay elements; the weighted signals added to the signals transferred from the preceding delay elements are transferred in a prescribed direction in the delay-addition device and the output signals having the desired frequency characteristics are derived from the delay-addition device as a filter output.

A charge transfer transversal filter according to this invention comprises means for branching off an input signal to form branched input signals; weighting means for generating an electric charge in a semiconductor substrate according to each of the branched input signals and so weighting each of the branched input signals as to cause the transversal filter to have a prescribed frequency characteristic; a charge transfer device formed of a plurality of unit delay elements formed in the upper surface of the semiconductor substrate and designed to add an electric charge delivered from the weighting means to an electric charge transferred from the preceding unit delay element and transfer the mixed charge in a prescribed direction; and output means for drawing out an output signal from the charge transfer device, wherein the delay and addition of electric charges is effected by the charge transfer device. Generation of the electric charge in the semiconductor substrate according to each of the branched input signals can be effected by forming a region in the upper surface of the semiconductor substrate with an opposite type of conductivity to said semiconductor substrate and injecting each of the branched input signal into said region. Weighting of an input signal is carried out by controlling an amount of electric charge produced in the semiconductor substrate. Therefore any desired weighting can be attained by selected of a value of a capacitance or a channel conductance or controlling an input signal itself. The charge transfer device of this invention may be either BBD or CCD which has, as is well known, a large number of transfer electrodes linearly arranged on the surface of a semiconductor substrate with an insulating layer interposed between each electrode and substrate surface.

BRIEF DESCRIPTION OF THE DRAWING

The invention will be more fully understood by reference to the following description when taken in conjuction with the appended drawings in which.

There will now be described by reference to FIG. 1 the fundamental arrangement of a transversal filter according to this invention.

DETAILED DESCRIPTION OF THE PREFERRED EMBODIMENTS

A plurality of branch lines 2, 3, 4, 5, 6 are connected to an input terminal 1. Circuits 12, 13, 14, 15, 16 carrying out different degrees of weighting are respectively connected to the branch lines 2, 3, 4, 5, 6. The output terminals of the weighting circuits 12, 13, 14, 15 16 are connected to delay elements 22, 23, 24, 25, 26 respectively. These delay elements 22, 23, 24, 25, 26 are connected in series to form a delay-addition circuit 27. The output terminal of the rearmost delay element 26 is connected to the output terminal 31 of the transversal filter.

An input signal supplied to the input terminal 1 of the transversal filter is branched by the branch lines 2, 3, 4, 5, 6. The branched input signals are respectively multiplied and weighted by weight coefficients $h_1$, $h_2$ to $h_M$ equal to the Fourier coefficients used in the Fourier expansion of a function representing the desired frequency characteristic of the transversal filter. The input signal branches thus weighted are supplied to the delay elements 22, 23, 24, 25, 26 of the delay circuit 27 to be delayed for a prescribed length of time. Output signals from the delay elements 22, 23, 24, 25, 26 are in succession added up to the output signals from the preceding delay elements, thereby providing an output signal capable of giving a prescribed impulse response at an output terminal 31.

Figure 1:
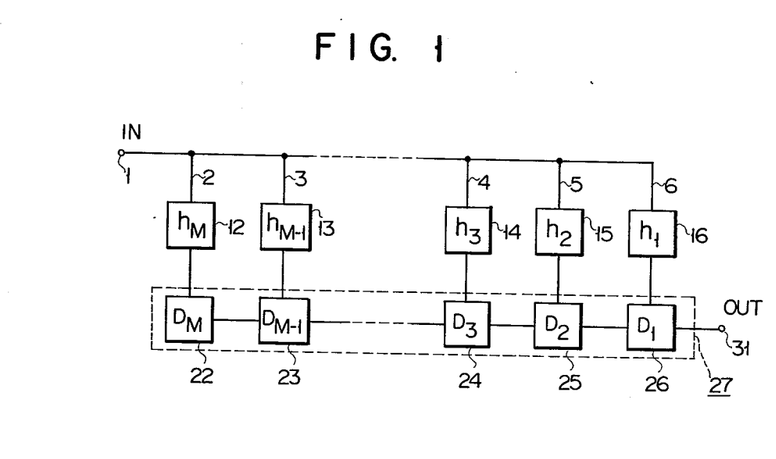
FIG. 1 is a block circuit diagram showing the fundamental arrangement of a transversal filter according to this invention.

There will now be described mathematically the process by which the circuit arrangement of FIG. 1 provides a transversal filter embodying this invention. An output signal from a given unit delay element is expressed by a sum of an input signal branch $V_{in}$ multiplied by, for example, a weighting coefficient $h_M$ and delayed by said delay element for a time of $T_c$ and another signal produced at the output terminal of the proceding delay element a time of $T_c$ ago and delayed also for a time of $T_c$. Therefore, an output signal $V_{out}$ from a transversal filter comprising an M number of unit delay elements may be expressed as follows:

$$V_{out} = h_1 V_{in}[(n-1)T_c] + \qquad (2)$$
$$h_2 V_{in}[(n-2)T_c] \ldots +$$
$$h_M V_{in}[(n-M)T_c] =$$
$$\sum_{k=1}^{M} h_k V_{in}[(n-k)T_c]$$

The equation (2) above which represents the same output signal expressed by the equation (1) clearly shows that the circuit arrangement of FIG. 1 constitutes a transversal filter.

The transversal filter of FIG. 1 causes the delay and addition of the respective input signal branches to be effected by a single delay-addition circuit 27, eliminating the necessity of providing a delay circuit and an addition circuit separately, decreasing the required number of circuit elements, and in consequence elevating a yield in integrating the transversal filter.

The delay-addition circuit 27 of FIG. 1 may be formed of CTD such as BBD or CCD, thus providing a very good transversal filter.

Figure 2:
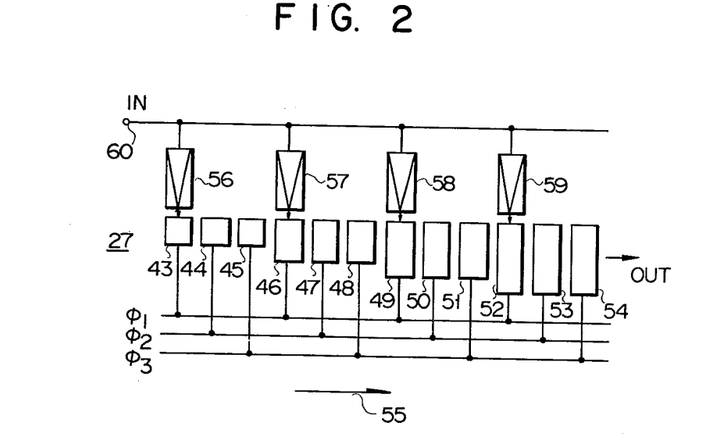
FIG. 2 is a schematic block circuit diagram in which a 3-phase driven CCD is applied to the transversal filter of FIG. 1.
Figure 3A:
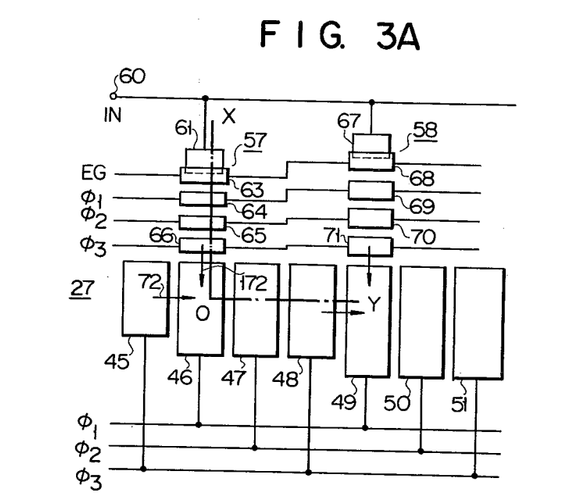
FIG. 3A is a plan view of an embodiment of this invention wherein a transversal filter is formed of a 3-phase driven CCD.

There will now be described by reference to FIGS. 2, 3A and 3B an embodiment of this invention which is formed of a 3-phase driven CCD. FIG. 2 schematically illustrates said embodiment, and FIG. 3A shows a practical arrangement of a weighting circuit with two adjacent weighting circuits and the corresponding unit delay elements selected. According to the embodiment of FIG. 2, transferring electrodes 43, 44, 45 . . . 54 are linearly arranged on an N type silicon semiconductor substrate 41 (FIG. 3B) with an insulation layer 42 (FIG. 3B) made of, for example, $SiO_2$ interposed between the transferring electrodes and semiconductor substrate. The transferring electrodes are used in the 3-phase driven CCD, and every three of them as 43-44-45, 46-47-48, 49-50-51, 52-53-54 respectively form a unit delay element, as is well known. 3-phase clock signals $\phi_1$, $\phi_2$, $\phi_3$ are supplied to the corresponding electrodes of each unit delay element.

With the embodiment of FIG. 2, a transferred charge progressively increases, as later described, in the transfer direction 55 for each unit delay element. Consequently, the three transferring electrodes of equal area constituting the respective unit delay elements are made progressively to increase in area in the transfer direction 55. The electrodes of all the unit delay elements may be made equal in area to the electrodes of that last stage of the unit delay elements which is disposed near the output terminal.

The respective unit delay elements are provided with the corresponding weighting circuits 56, 57, 58, 59, whose input terminals are jointly connected to the input terminal 60 of the transversal filter.

Figure 3B:
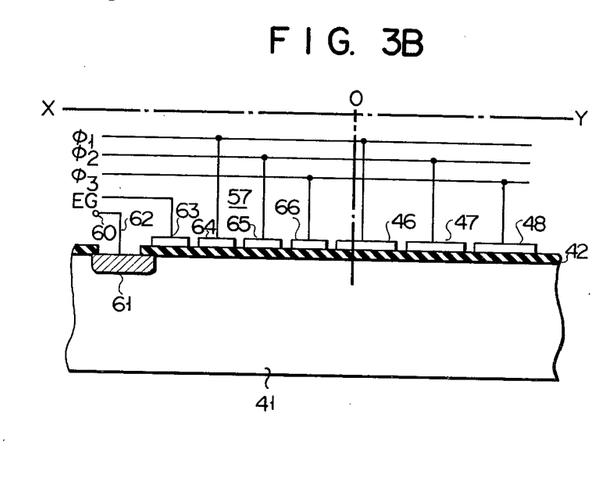
FIG. 3B is a cross sectional view of said embodiment in line X-Y of FIG. 3A.

The practical arrangement of the weighting circuits 56, 57, 58, 59 is set forth in FIGS. 3A and 3B. A source region 61 (FIG. 3B) is formed in the upper surface of the semiconductor substrate 41 with an opposite conductivity type to the substrate 41. An electrode lead 62 is mounted on the source region 61 for connection to the input terminal 60 of the transversal filter. The insulation layer 42 is formed on the semiconductor substrate 41. Arranged on said insulation layer 42 are an input gate electrode 63, sampling electrode 64, weighting electrode 65 and shifting electrode 66 in succession. The input gate electrode 63 is partly spread on to the source region 61. The shifting electrode 66 is so disposed as to cause an electric charge to be injected into a potential well formed under the transferring electrode 46. The source region 61, input gate electrode 63, sampling electrode 64, weighting electrode 65 and transferring electrode 66 constitute the weighting cicuit 57.

The weighting circuit 58 is formed of a source region 67, input gate electrode 68, sampling electrode 69 weighting electrode 70 and shifting electrode 71. A shifting electrode 71 is so positioned as to cause an electric charge to be injected into a potential well formed under the transferring electrode 49.

There will now be described the operation of an embodiment of this invention including a weighting circuit shown in FIGS. 3A and 3B. An input signal carried into the transversal filter at the input terminal 60 is split into branches which in turn are supplied to the source regions 61, 67 of the weighting circuits 57, 58 respectively to produce an electric charge in said source regions 61, 67 in an amount corresponding to the input signal. The input gate electrodes 63, 68 are impressed with a DC voltage $E_G$. The sampling electrodes 64, 69, weighting electrodes 65, 70 and shifting electrode 66, 71 are supplied with the same 3-phase driving pulses $\phi_1$, $\phi_2$, $\phi_3$ as those supplied to, for example, the transferring electrodes 43 to 54. The D.C. voltage $E_G$ impressed on the input gate electrodes 63, 68 is intended to prevent the source regions 61, 67 and sampling electrodes 64, 69 from being connected together in terms of capacity and to prevent a spike noise from entering into the input signal, and has a larger value than the 3-phase driving pulses. As the weighting circuits 57, 58 are formed of a 1 bit CCD, an electric charge generated from the source regions 61, 67 is transferred through potential wells formed below the respective electrodes under control by the 3-phase driving pulse in the direction of the indicated arrow 172 toward the transferring electrode 46.

Weighting of an input signal by the weighting circuits 57, 58 is effected by selecting the capacity of the weighting electrodes 65, 70.

An amount $Q_{sig}$ of electric charge brought from the source regions 61, 67 through the input gate electrodes 63, 68 into the potential wells formed below the weighting electrodes 65, 70 may be expressed as follows:

$$Q_{sig} = C_o (\psi_{max} - \psi_s)$$

when $C_o$ is taken to denote the capacity of the weighting electrodes, $\psi_s$ the source potential, and $\psi_{max}$ a surface potential arising in the absence of an input signal under the weighting electrodes 65, 70. As apparent from the above equation, the amount $Q_{sig}$ of signal charge is proportional to the capacity $C_o$ of the weighting electrode. The capacity $C_o$ of the weighting electrodes 65, 70 may be expressed as follows:

$$C_o = \epsilon S/d$$

when $\epsilon$ is taken to represent the dielectric constant of the insulation layer 42 disposed under the weighting electrodes 65, 70, $d$ the thickness of the insulation layer 42, and S the area of the weighting electrodes 65, 70. As seen from the above equation, an electric charge from the source regions 61, 67 is proportional to the area of the weighting electrodes 65, 70 and inversely proportional to the thickness of the insulation layer 42. If, therefore, a product arrived at by multiplying the area of the weighting electrodes 65, 70 by a reciprocal of the thickness of the insulation layer 42 is chosen to be proportional to a prescribed weighting coefficent, then an amount of electric charge delivered from the source regions 61, 67 will be controlled in proportion to the prescribed weighting coefficient, that is, an input signal will be weighted as desired. In other words, an input signal is weighted by the weighting circuits 57, 58 by varying the thickness of the insulation layer 42 and/or the area of the weighting electrodes 65, 70. It is therefore advised that an input signal be so weighted as to cause the transversal filter to display a prescribed frequency characteristic.

When a signal charge is transferred in the direction of the indicated arrow 72 from the potential well formed below the preceding transferring electrode 45 of the preceding unit delay element to the potential well provided below the immediately following transferring electrode 46 of the succeeding unit delay element due to the shifting of the 3-phase driving pulses from $\phi_3$ to $\phi_1$, then an electric charge delivered from the source region 61 which is weighted as desired by the weighting electrode 65, is shifted as the result of the shifting of the driving pulses from $\phi_3$ to $\phi_1$ in the direction of the indicated arrow 172 from the potential well formed below the shifting electrode 66 to the potential well disposed below the transferring electrode 46. Accordingly, the electric charge stored in the potential well formed below the shifting electrode 66 and the electric charge stored in the potential well provided below the transferring electrode 45 are conducted at the same time to the potential well lying below the transferring electrode 46. At the transferring electrode 46, therefore, the electric charge weighted as prescribed and the electric charge transferred from the unit delay element immediately preceding the transferring electrode 46 are added together.

The electric charge injected into the potential well below the transferring electrode 46 is further transferred along the transferring electrodes 43 to 54 by the 3-phase driving pulses $\phi_1$, $\phi_2$, $\phi_3$ supplied to the transferring electrodes 43 to 54. When the electric charge is transmitted from the potential well below the transferring electrode 48 to the potential well below the transferring electrode 49 of the succeeding unit delay element, the electric charge from the source region 67 weighted by the weighting circuit 58 in transferred from the potential well below the shifting electrode 71 to the potential well below the transferring electrode 49. As the result, addition is made in the potential well below the transferring electrode 49. The mixture of electric charges is further transferred by 3-phase driving pulses supplied to the transferring electrodes.

The above-described operation is repeated sequentially at each of the unit delay element, thereby achieving an operation of the transversal filter of this invention.

According to the embodiment of this invention comprising the weighting circuits 57, 58 of FIGS. 3A and 3B, the input gate electrodes 63, 68 may be omitted. If, however, these input gate electrodes 63, 68 are omitted, then the driving clock pulses applied to the sampling electrodes 64, 69 will give rise to induction in the source regions 61, 67 and in consequence the electric charges produced from said source regions 61, 67 will not fully match the input signal. Further, the shifting electrodes 66, 71 may be omitted.

A transversal filter according to the embodiment of FIGS. 3A and 3B, having CCD without floating gates or floating junctions can be operated at a sufficiently high speed. Further, the delay and addition of weighted charges are carried out by a single delay-addition circuit formed of CCD, thereby reducing the number of the required circuit elements, elevating a yield in manufacturing the transversal filter and rendering the circuit arrangement much simpler than possible in the past.

There will now be described by reference to FIGS. 4A and 4B a transversal filter according to another embodiment of this invention, in which the weighting circuits 57, 58 are formed of field effect transistors.

Figure 4A:
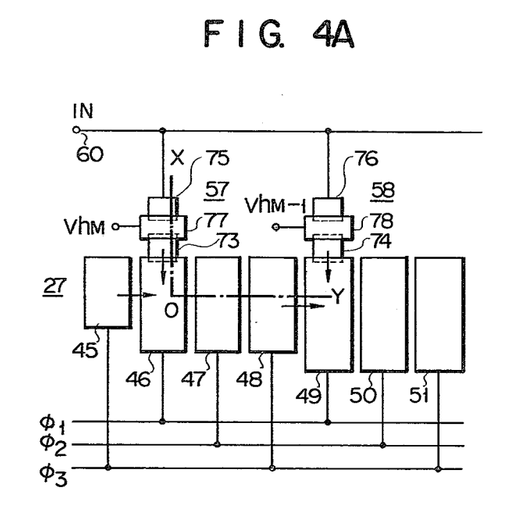
FIG. 4A is a plan view of another embodiment of the invention wherein a transversal filter is partly formed of a 3-phase driven CCD.
Figure 4B:
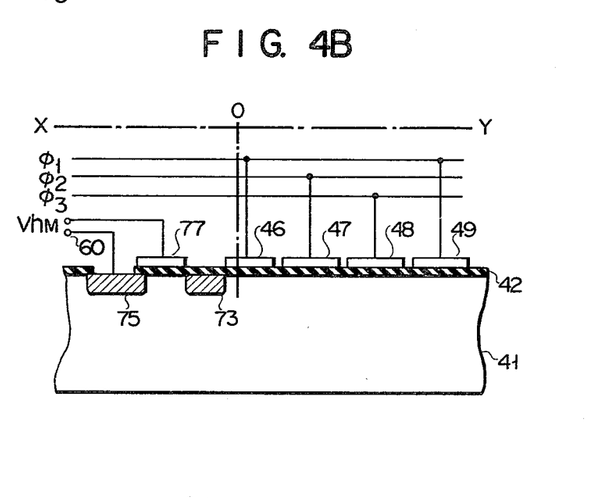
FIG. 4B is a cross sectional view of said another embodiment on line X-Y of FIG. 4A.

The delay-addition circuit 27 of FIGS. 4A and 4B have the same arrangement as that of FIGS. 3A and 3B. Therefore, the parts of FIGS. 4A and 4B the same as those of FIGS. 3A and 3B are denoted by the same numerals, description thereof being omitted.

The weighting circuit 57, 58 are constructed such that a region is formed in those parts of the upper surface of the N type semiconductor substrate 41 which are positioned adjacent to the transferring electrodes 46, 49 with an opposite conductivity type to said substrate, that is, the P type to provide floating junction region 73, 74. Source regions 75, 76 having an opposite conductivity type to the N type semiconductor substrate 41, that is, the P type are formed in the upper surface of said substrate 41 apart from the floating junction region 73, 74. A gate electrode 77 is formed on the semiconductor insulation layer 42 to span the floating junction 73 and source region 75, and a gate electrode 78 is mounted on said insulation layer 42 to span the floating junction 74 and source region 76. The weighting circuit 57 is formed of an insulated gate field effect transistor comprising the floating junction region 73, source region 75 and gate electrode 77, and the weighting circuit 58 is formed of an insulated gate field effect transistor comprising the floating junction region 74, source region 76 and gate electrode 78.

An input signal supplied from the input terminal 60 of the transversal filter is split into a plurality of branches which in turn are conducted to the source regions 75, 76 respectively to generate therein a voltage corresponding to the input signal. Selection of the channel conductance of the field effect transistor 57 or 58 enables a prescribed amount of electric charge to be brought from source regions 75, 76 into a potential well formed below the transferring electrode 46 or 49 through the floating junction region 73 or 74. Namely, with the weighting circuits 57, 58 each input signal branch is weighted by a change in the channel conductance of an insulated gate type field effect transistor. The channel conductance is determined by the length of the channel and the gate voltage. The channel length is herein defined in means a distance between the source region 75 and floating junction region 73 or between the source region 76 and floating junction region 74. The gate voltage Vhm is impressed on the gate electrode 77 and the voltage $V_{hm-1}$ is supplied to the gate electrode 78. An input signal branch is weighted by varying at least either of the channel lengths and the gate voltages $V_{hM}$, $V_{hM-1}$. If the gate voltages $V_{hM}$, $V_{hM-1}$ are constituted by electric signals supplied from an outside device, the desired frequency characteristic of the transversal filter can be programmed using the gate voltages.

Where the weighting circuit 57, 58 is formed of a field effect transistor having a memory function such as the known FAMOS or MNOS type, then the channel conductance of said transistor can be varied by supplying an external electric signal to the gate electrode thereby to be programmed and memorized, making it possible to provide a transversal filter capable of programming and memorizing a prescribed frequency characteristic.

There will now be described by reference to FIG. 5 still another embodiment of this invention in which the weighting circuits 57, 58 are provided for the direct weighting of branched input signals. According to the weighting circuits 57, 58 of the embodiment of FIG. 5, the electrode G1 of one 107 of two series-connected MOSFET's 106, 107 and the gate electrode G1 of one 117 of two series-connected MOSFET's 116, 117 are jointly connected to the input terminal 60 of the transversal filter. The gate electrodes G2 of the other MOSFET's 106, 116 are impressed with weighting voltage signals $V_{hM}$, $V_{hM-1}$ respectively. The drains D of the MOSFET's 106, 116 are supplied with D.C. voltage $V_{DD}$ through the corresponding load resistors 105, 115. The drains D of the MOSFET's 106, 116 are connected to the source regions 161, 167 respectively. With the MOSFET 106, the source region 161, input gate electrode 163, and shifting electrodes 164, 165, 166 are arranged in the order mentioned. With the MOSFET 116, the source region 167, input gate electrode 168 and shifting electrodes 169, 170, 171 are arranged similarly in the order mentioned.

Figure 5:
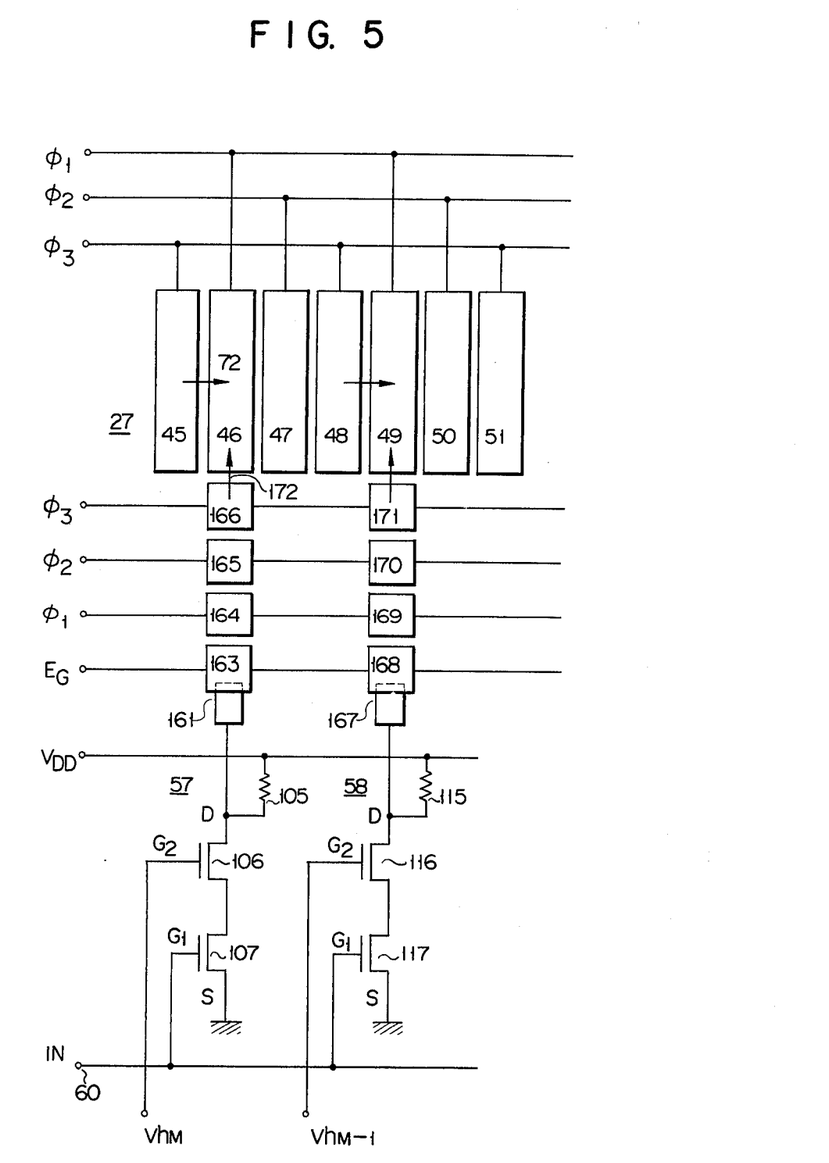
FIG. 5 is a plan view of still another embodiment of the invention wherein a transversal filter is partly formed of a 3-phase driven CCD.

The delay-addition circuit 27 of the embodiment of FIG. 5 has the same arrangement as that of FIGS. 3A and 3B. The parts of FIG. 5 the same as those of FIGS. 3A and 3B are denoted by the same numerals, description thereof being omitted. With the weighting circuits 57, 58 arranged as described above, the weighting voltages $V_{hM}$, $V_{hM-1}$ control signal current running through the series connected MOSFET's 106, 107 and the series connected MOSFET's 116, 117. An input signal voltage whose amplitude has been controlled by the weighting voltage $V_{hM}$ is produced across the load resistor 105. Another input signal voltage with the amplitude controlled by the weighting voltage $V_{hM-1}$ is obtained across the load resistor 115. The input signals weighted by the weighting voltages $V_{hM}$, $V_{hM-1}$ respectively are supplied to the corresponding source regions 161, 167 to generate voltages therein. The electric charges proportional to the voltages are transferred along one group of electrodes 163, 164, 165, 166 and another group of electrodes 168, 169, 170, 171 into potential wells below the corresponding transferring electrodes 46, 49 respectively. With the embodiment of FIG. 5, therefore, the weighting of the input signal can be effected by directly controlling the voltage level of said branched input signals by the weighting voltage $V_{hM}$ or $V_{hM-1}$. In this case, too, the programming of a transversal filter can be carried out by externally supplied weighting voltages $V_{hM}$, $V_{hM-1}$. In this embodiment, input gate electrodes 163, 168 and shifting electrodes 164, 165, 166 and 169, 170, 171 may be partly or wholly omitted.

Figure 6:
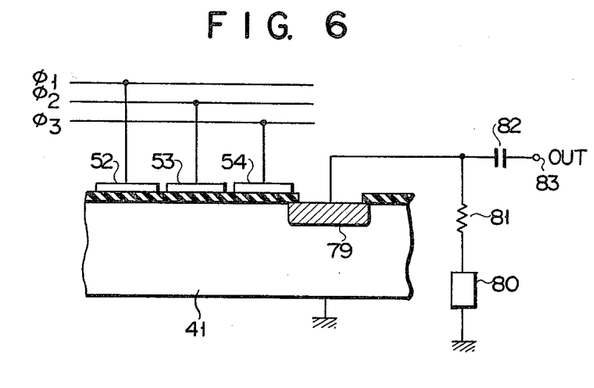
FIGS. 6 and 7 are cross sectional views of different embodiments of the output section of the invention.

There will now be described by reference to FIG. 6, the output device by which an electric charge transferred along the transferring electrodes 52, 53, 54 of the delay-addition circuit 27 is drawn out as an output. The withdrawal of the output from CCD can be effected simply by using the known means, detailed description of the output withdrawing operation being omitted.

A signal charge sent forward along the transferring electrodes 52, 53, 54 is carried into a drain region 79 which is formed in the semiconductor substrate 41 which is grounded. The drain region 79 is reversely biased by a bias source 80 relative to the junction of said drain region 79 and semiconductor substrate 41. As the result, a signal charge flows from the drain region 79 through a load resistor 81 to produce potential difference across both ends of the load resistor 81. The potential difference is conducted through a capacitor 82 to be produced as an output signal at an output terminal 83 of a transversal filter.

Figure 7:
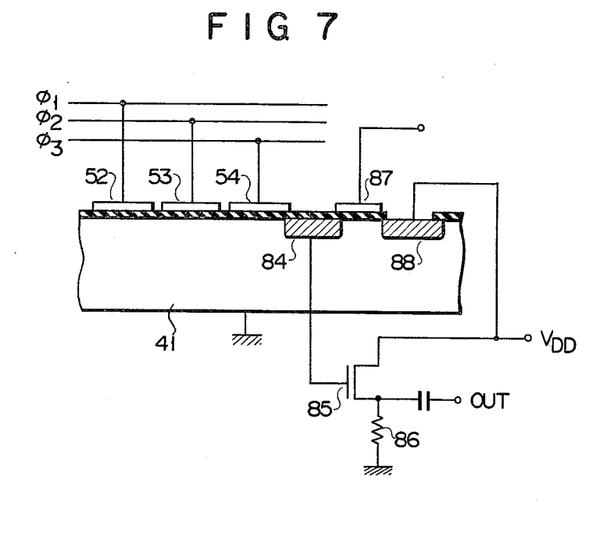

There will now be described by reference to FIG. 7 another embodiment of output signal withdrawing means. A signal charge transferred through the potential wells formed below the transferring electrodes 52, 53, 54 is injected into a floating junction region 84 which is formed in the semiconductor substrate 41 which is grounded. At this time, a reset gate 87 is closed. Since the floating junction region 84 is connected to the gate of a field effect transistor 85, the gate potential changes when the floating junction region 84 is supplied with an electric charge. This change is detected between both ends of a resistor 86 as an output from a source follower field effect transistor, that is, from a transversal filter. Later when the reset gate 87 is opened, a signal charge stored in the floating junction region 84 runs into a drain region 88 through a reset gate 87. Repetition of the above-mentioned operation in the output withdrawing means of FIG. 7 enables a larger output signal to be produced from a transversal filter than the output withdrawing means of FIG. 6.

Figure 8A:
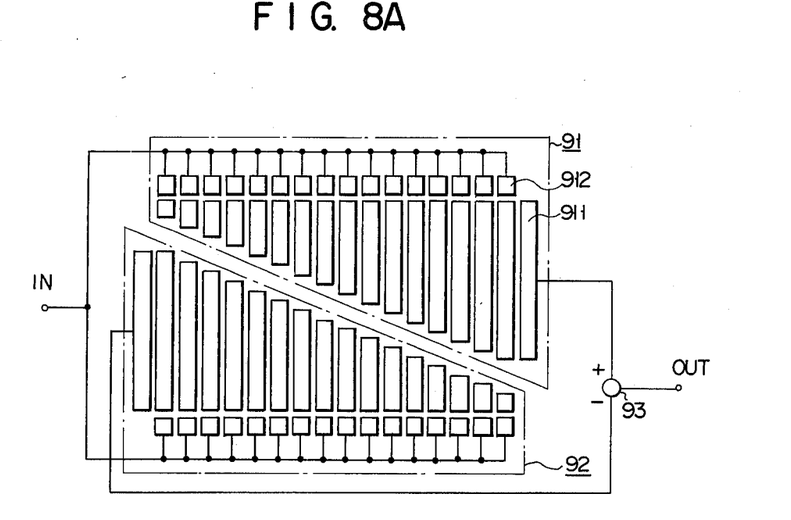
FIGS. 8A and 8B are plan views of different patterns in which the transversal filter of the invention is arranged.
Figure 8B:
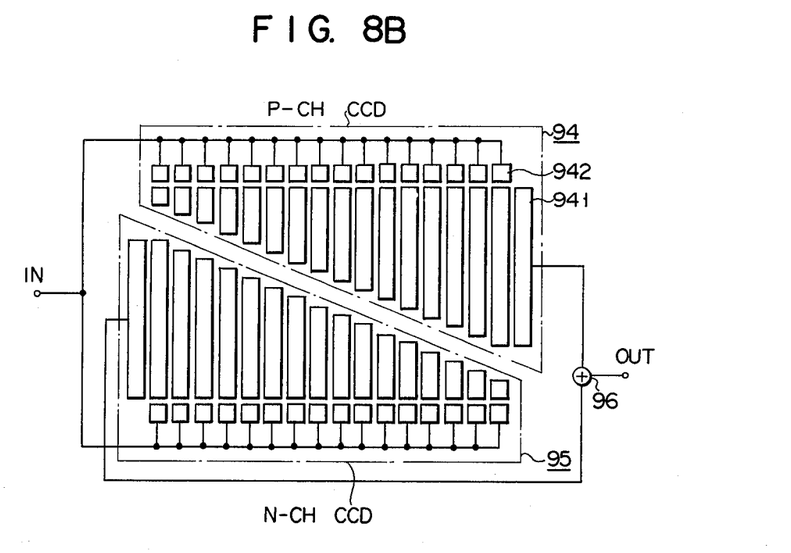

Depending on the frequency characteristics demanded of a transversal filter, the weighting coefficients some times have positive and negative values. FIGS. 8A and 8B set forth the arrangements of a transversal filter in which the weighting coefficients take positive and negative values respectively. The transversal filter of FIG. 8A comprises a group 91 of unit delay elements giving positive weighting coefficients and another separately provided group 92 of unit delay elements presenting negative weighting coefficients. The group 92 of unit delay elements conducts effectively negative weightings by reversing the polarity of an output signal therefrom. Therefore, the output signals from the group 91 of unit delay elements and the signal obtained by reversing the polarity of the output signal from the group 92 of unit delay elements are mixed at a mixing circuit 93, thereby providing a transversal filter having positive and negative weighting coefficients. Referring to FIG. 8A, referential numeral 911 denotes a unit delay element and referential numeral 912 shows a weighting circuit.

Now referring to FIG. 8B, a group 94 of unit delay elements providing a positive weighting coefficient and another group 95 of unit delay elements giving a negative weighting coefficient are formed of CTD's having different conductivity type namely, those semiconductor substrates have opposite P and N conductivity types. With the P- and N-channel derives, output signals from the groups 94, 95 of unit delay elements are summed up by an adder 96 to carry out positive and negative weighting, utilizing the signal charges of opposite polarities produced by said groups 94, 95. Referential numeral 941 shows a unit delay element, and referential numeral 942 denotes a weighting circuit.

As mentioned above, the transversal filter of this invention wherein the respective branches of an input signal are weighted in proportion to a prescribed weighting coefficient and the branched input signals thus weighted are supplied to the sequentially arranged transferring elements to be added up in succession, has the advantages that the delay and addition of the weighted input signal branches are effected by a single element, decreasing number of circuit elements with the resultant elevated yield of manufacture; a high speed operation is attained; an excellent frequency characteristic is obtained and is capable of being programmed; and an output signal is detected easily.

The foregoing embodiments refer to the case where a transversal filter was formed of CCD. However, any other element such as BBD may obviously be applied, provided it transfers an electric charge.

Further, the foregoing embodiments refer to the case where the CCD used was of a 3-phase driven type. However, the CCD may of course be of a 2-phase, single phase or 4-phase driven type.

What we claim is:

1. A charge transfer transversal filter comprising:
    a charge transfer device comprising a plurality of stages having transfer electrodes arranged to transfer a signal charge from the first stage to the final stage successively;
    a plurality of input means connected to receive simultaneously an analog input signal and each arranged to weight the analog input signal in accordance with a weighting coefficient for producing a weighted charge and supplying the weighted charge to the corresponding stage of the charge transfer device during signal charge transfer of the charge transfer device; and
    output means coupled to the final stage of the charge transfer device for deriving an output signal of the transversal filter.

2. A charge transfer transversal filter according to claim 1 wherein each of the plurality of input means comprises a field effect transistor having a first region formed in a semiconductor substrate of one conductivity type having a conductivity type opposite to the substrate and connected to receive the analog input signal and a second region having the same conductivity type as the first region and formed in the semiconductor substrate spaced apart from the first region and adjacent to the corresponding stage of the charge transfer device, and a gate electrode disposed on an insulation layer formed on the substrate for controlling the conductance between the first and second regions.

3. A charge transfer transversal filter according to claim 1 wherein the area of each of the transfer electrodes of the respective stages of the charge transfer device is made larger than that of each of the transfer electrodes of the immediately preceding stage.

4. A charge transfer transversal filter according to claim 1 wherein each of the plurality of of input means comprises a source region formed in a semiconductor substrate of one conductivity type having a conductivity type opposite to the semiconductor substrate and connected to receive the analog input signal to produce a signal charge; a sampling means for sampling the signal charge; and a weighting means for weighting the sampled charge from the sampling means.

5. A charge transfer transversal filter according to claim 4 wherein the sampling means and weighting means respectively comprise a sampling electrode and a weighting electrode disposed on an insulation layer formed on the semiconductor substrate to which multiphase clock signals are applied.

6. A charge transfer transversal filter according to claim 5 wherein the weighting electrode has an area proportional to a weighting coefficient.

7. A charge transfer transversal filter according to claim 5 wherein the insulation layer below the weighting electrode has a thickness inversely proportional to a weighting coefficient.

8. A charge transfer transversal filter comprising:
a charge transfer device comprising a plurality of stages to transfer a signal charge from the first stage to the final stage successively;
a plurality of series combinations each having a load resistive impedance means, first and second insulated gate field effect transistors connected in series between power supply terminals, the gate electrodes of the first and second insulated gate field effect transistors respectively connected to receive a weighting voltage signal and an analog input signal to develop a weighted analog signal across the load resistive impedance means;
a plurality of means each responsive to the weighted analog signal developed across the corresponding load resistive impedance means to produce a signal charge and supply the signal charge into the corresponding stage of the charge transfer device; and
output means coupled to the final stage of the charge transfer device for deriving an output signal of the transversal filter.

9. A charge transfer transversal filter according to claim 8 wherein the plurality of means each includes means for sampling the weighted analog signal to produce the sampled signal charge and means for shifting the sampled signal charge to the corresponding stage of the charge transfer device.

10. A charger transfer transversal filter comprising: first and second transversal filters for the same analog input signal, each of the first and second transversal filters comprising:

a charge transfer device having a plurality of stages having transfer electrodes arranged to transfer a signal charge from the first stage to the final stage successively; a plurality of input means connected to receive the analog input signal and each arranged to weight the analog input signal for producing a weighted charge and supplying the weighted charge to the corresponding stage of the charge transfer device; and output means coupled to the final stage of the charge transfer device for deriving an output signal of the transversal filter; and combining means for combining the output signals of the first and second transversal filters.

11. A charge transfer transversal filter according to claim 10 wherein the area of each of the transfer electrodes of the respective stages of the charge transfer device in each of the first and second transversal filters is made larger than that of each of transfer electrodes of the immediately preceding stage.

12. A charge transfer transversal filter according to claim 10 wherein the charge transfer devices of the first and second transversal filters are of the same conductivity type and the combining means is a subtractor.

13. A charge transfer transversal filter according to claim 10 wherein the charge transfer devices of the first and second transversal filters are of the opposite conductivity type and the combining means is an adder.

14. A charge transfer transversal filter comprising means for branching an input signal into a plurality of branched input signals; a plurality of weighting means supplied with said branched input signals respectively for weighting said branched input signals to produce electric charges in a semiconductor substrate so that the filter has a prescribed frequency characteristic; charge transferring means comprising a plurality of delay means formed in the said semiconductor substrate and connected to the corresponding weighting means for adding said electronic charge supplied to the corresponding delay means from the weighting means to those transferred from the preceding delay means and for transferring the added charges in a prescribed direction along the delay means; means for drawing out an output signal from said charge transferring means; the output withdrawing means comprising a first floating junction region formed in the upper surface of the semiconductor substrate with an opposite conductivity type to said substrate at a point adjacent to the terminal delay element of the charge transferring means; a second region formed in the upper surface of the semiconductor substrate apart from the first region with an opposite conductivity type to said substrate; a reset gate electrode mounted on the semiconductor substrate to span the first and second regions with an insulation layer interposed between said gate electrode and substrate; and transistor means whose input electrode is connected to the first region, whose first electrode is connected to the second region and whose second electrode is grounded through an output resistor, whereby, when an electric charge is supplied from the charge transferring means to the first region, said electric charge prevents a reset signal applied to the reset gate electrode from being transferred from the first to the second region, an output from the transversal filter is detected at the terminal of the output resistor of the transistor means; and thereafter the electric charge is so controlled by the gate electrode as to be delivered from the first to the second region.

* * * * *